(12) United States Patent
Lee et al.

(10) Patent No.: US 11,749,148 B2
(45) Date of Patent: Sep. 5, 2023

(54) DISPLAY APPARATUS

(71) Applicant: LG DISPLAY CO., LTD., Seoul (KR)

(72) Inventors: Seyong Lee, Gimpo-si (KR); SungHyun Jang, Paju-si (KR); JungWoo Han, Cheongju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/537,684

(22) Filed: Nov. 30, 2021

(65) Prior Publication Data
US 2022/0187939 A1     Jun. 16, 2022

(30) Foreign Application Priority Data
Dec. 15, 2020 (KR) ..................... 10-2020-0175 813

(51) Int. Cl.
| | |
|---|---|
| *G09G 3/00* | (2006.01) |
| *G06F 3/044* | (2006.01) |
| *H10K 59/40* | (2023.01) |
| *H10K 59/131* | (2023.01) |
| *G06F 3/041* | (2006.01) |
| *H10K 50/84* | (2023.01) |
| *H10K 50/844* | (2023.01) |

(52) U.S. Cl.
CPC ........... *G09G 3/006* (2013.01); *G06F 3/0412* (2013.01); *G06F 3/0416* (2013.01); *H10K 50/84* (2023.02); *G06F 3/0446* (2019.05); *G09G 2310/08* (2013.01); *H10K 50/844* (2023.02); *H10K 59/131* (2023.02); *H10K 59/40* (2023.02)

(58) Field of Classification Search
CPC .... G06F 3/0412; G06F 3/0416; G06F 3/0446; G06F 11/2221; G09G 3/006; G09G 2310/08; H01L 27/323; H01L 27/3262; H01L 27/3276; H01L 51/0031; H01L 51/5237; H01L 51/5253; H10K 50/84; H10K 59/131; H10K 59/40; H10K 50/844

See application file for complete search history.

(56) References Cited

U.S. PATENT DOCUMENTS

| | | | |
|---|---|---|---|
| 2018/0061899 A1* | 3/2018 | Oh ....................... | H01L 27/3258 |
| 2018/0150162 A1 | 5/2018 | Kim et al. | |
| 2018/0190724 A1* | 7/2018 | Kang ................... | H01L 27/323 |

FOREIGN PATENT DOCUMENTS

| | | | |
|---|---|---|---|
| CN | 113721093 A | * | 11/2021 |
| KR | 10-2018-0061883 A | | 6/2018 |
| KR | 10-2020-0078829 A | | 7/2020 |

* cited by examiner

*Primary Examiner* — Julie Anne Watko
(74) *Attorney, Agent, or Firm* — Morgan, Lewis & Bockius LLP

(57) ABSTRACT

A display apparatus according to an example embodiment may include: a substrate including a display area and a non-display area outside the display area; a plurality of pixels in the display area; a plurality of touch electrodes overlapping with the pixels in the display area; a gate driving circuit in the non-display area and connected to the touch electrodes via at least one gate driving line; and a touch inspection circuit in the non-display area and connected to the touch electrodes through at least one touch line, the touch inspection circuit including at least one touch inspection switch and a touch inspection control switch.

20 Claims, 4 Drawing Sheets

DISPLAY APPARATUS

CROSS-REFERENCE TO RELATED APPLICATIONS

This application claims the priority of Korean Patent Application No. 10-2020-0175813 filed on Dec. 15, 2020, in the Korean Intellectual Property Office, the disclosure of which is incorporated herein by reference as if fully set forth herein.

BACKGROUND

1. Technical Field

The present disclosure relates to a display apparatus and, more particularly, to a display apparatus with a touch sensing function embedded therein.

2. Description of the Related Art

Recently, with the rise of an information era, displays capable of visually expressing electrical information signals have rapidly been developed. In this regard, various types of display apparatuses having good performance characteristics, such as a thin profile, light weight, and low power consumption, have been developed.

Specific examples of such display apparatuses may include a liquid crystal display apparatus (LCD), an organic light emitting display apparatus (OLED), a quantum dot display apparatus, and the like.

The organic light emitting display apparatus may include a display panel and a plurality of components for providing various functions. For example, one or more display driving circuits for controlling the display panel may be included in a display assembly. Examples of the driving circuits include gate drivers, light emitting (source) drivers, power (VDD) routing, electrostatic discharge (ESD) circuits, multiplex (MUX) circuits, data signal lines, cathode contacts, and other functional elements.

To improve the convenience of users, display panels with an embedded touch sensing function are being developed and commercially utilized. The touch sensing function, for example, is a function of detecting a position of a contact point of a human hand or an object in the display area and may be used for intuitively receiving a command of the user.

For example, a method for embedding the touch sensing function in a display panel may include providing an add-on type or an in-cell type. According to the add-on type, a separate touch panel for the touch sensing function is attached to the display apparatus. In contrast, according to the in-cell type, at least one of the components used for an image output function of the display panel is also used to implement the touch sensing function.

The add-on type has a possible advantage in that, as a separate touch panel is included, the image output function and the touch sensing function can be independently driven without influencing on each other such that it may be easier to inspect the touch panel for a defect. That is, in the case of the add-on type, before attaching the touch panel to the display panel, the touch panel may be inspected for a defect so that a defect rate of the display panel may be irrelevant to whether the touch sensing function is defective. However, the add-on type also has potential disadvantages. For example, since a separate touch panel is added, any reduction in weight and thickness of the display apparatus may be more restricted. Also, some amount of light emitted from the display panel may be lost in transmission through the touch panel, causing degradation in display characteristics.

In contrast, for the in-cell type, a separate touch panel is not included so that it is easier to achieve light-weight and small-thickness as compared with the add-on type. However, because at least one component is shared for the image output function and the touch sensing function, the image output function and the touch sensing function are typically driven in a time-division manner so that the defect rate of the display panel may be affected by whether the touch sensing function is defective.

Generally, after manufacturing an in-cell type display panel, the display panel may be inspected using an auto-probe test method with an auto probing unit.

According to an auto-probe test method of the related art, after the auto probing unit is connected with the display panel via a pad for inspection equipped in the display panel, the same pixel signal and the same common signal are supplied to the plurality of sub pixels of the display panel using the auto probing unit. At this time, an inspection for a defect in the image output function may be performed by determining whether the luminance of the plurality of sub pixels is uniformly generated. To inspect whether the touch function is normally operated, a separate inspection process is performed by disposing a separate pad for touch inspection in addition to the method using the auto probing unit of the related art for the above inspection of the image output function. However, it is difficult to determine with the auto probing unit whether the touch sensing function is defective.

Accordingly, to confirm the normal operation of the touch function of the in-cell type display panel, a separate pad and a separate inspection process may be necessary. This presents problems in that the yield of the display apparatus may be lowered, and a total production time and a manufacturing cost required to manufacture a display apparatus may be increased.

SUMMARY

Accordingly, the present disclosure is directed to a display apparatus that substantially obviates one or more problems due to limitations and disadvantages of the related art.

An object of the present disclosure is to provide a display panel which is capable of being inspected with an auto probing unit not only for a defect in the image output function but also a defect in the touch sensing function.

In addition to the objects of the present disclosure as mentioned above, additional objects and features of the present disclosure will be clearly understood by those skilled in the art from the following description of the present disclosure.

To achieve these objects and other advantages and in accordance with the purpose of the present disclosure, as embodied and broadly described herein, a display apparatus may comprise: a substrate including a display area and a non-display area outside the display area; a plurality of pixels in the display area; a plurality of touch electrodes overlapping with the pixels in the display area; a gate driving circuit in the non-display area and connected to the touch electrodes via at least one gate driving line; and a touch inspection circuit in the non-display area and connected to the touch electrodes through at least one touch line, the touch inspection circuit including at least one touch inspection switch and a touch inspection control switch.

In another aspect of the present disclosure, a display apparatus may comprise: a substrate including a display area and a non-display area outside the display area; a plurality of light emitting diodes in the display area; a plurality of touch electrodes overlapping with the light emitting diodes in the display area; at least one touch inspection circuit in the non-display area and connected with the touch electrodes, the at least one touch inspection circuit including at least one touch inspection switch and a touch inspection control switch; at least one gate driving circuit in the non-display area and connected with the touch electrodes via at least one gate driving line; and a dam surrounding the display area.

Other possible details of various example embodiments are provided in the detailed description and the drawings.

According to the present disclosure, when an image display function of a display apparatus is inspected with an auto probing unit, it is also possible to check whether a touch sensing function operates normally, e.g., whether the touch lines provided in the display panel for the touch sensing function operate normally. The touch lines may be connected to basic signal lines for inspecting the image display function. A switch may be installed to inspect the image display function and then similarly inspect whether the touch lines operate normally by switching a setting of the switch.

If a short is generated between the touch lines or between a touch line and another line, a defect may be indicated on a display screen to be easily identified by the auto probing unit in a similar manner as in the inspection of image display function.

Accordingly, a short involving a touch line may be more readily or easily identified without having to inspect the touch function separately from the inspection of the image display function with the auto probing unit.

The objects to be achieved by the present disclosure, the means for achieving the objects, and effects of the present disclosure described above do not specify essential features of the claims. Thus, the scope of the claims is not limited to the disclosure of the present disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiment(s) of the disclosure and together with the description serve to explain the principles of the disclosure. In the drawings.

DETAILED DESCRIPTION

Figure 1:
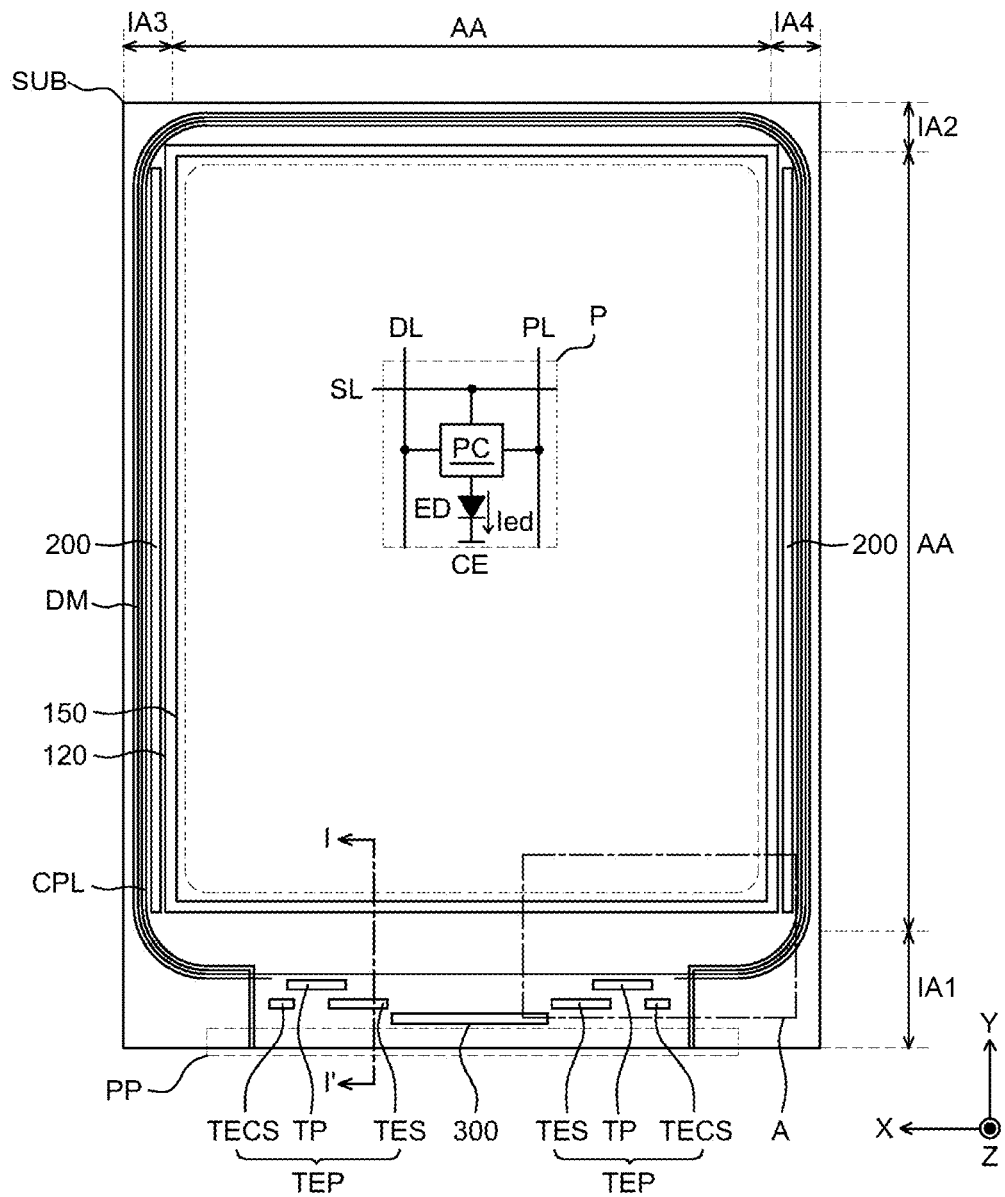
FIG. 1 is a plan view illustrating a display panel according to an example embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals generally denote like elements throughout the specification unless otherwise specified.

In the following description of the present disclosure, a detailed explanation of known related technologies may be omitted to avoid unnecessarily obscuring the subject matter of the present disclosure.

Where the terms "comprise," "have," "include," and the like are used, one or more other elements may be added unless the term, such as "only," is used. An element described in the singular form is intended to include a plurality of elements, and vice versa, unless the context clearly indicates otherwise In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Where a time sequence between two or more incidents is described using such terms as "after," "subsequent to," "next to," "before," and the like, the two or more incidents may be non-consecutive unless a more limiting term, such as "just," "immediate(ly)," or "direct(ly)," is used.

Although terms "first," "second," and the like may be used herein to describe various elements, these elements should not be limited by these terms as they are not used to define a particular order. These terms are used only to distinguish one element from another. For example, a first element could be termed a second element, and similarly, a second element could be termed a first element, without departing from the scope of the present disclosure.

The present disclosure may use terms like "first," "second," "A," "B," "(a)," and "(b)." These terms are used merely for differentiating or distinguishing one element from another element, and the essence, sequence, order, or number of a corresponding element is not limited by the terms. For example, a first element could be termed a second element, and, similarly, a second element could be termed a first element, without departing from the scope of the present disclosure.

Where an element or layer is described as being "connected," "coupled," or "adhered" to another element or layer, the element or layer may be directly or indirectly connected, coupled, or adhered to the other element or layer. For example, other element(s) or layer(s) may be "disposed"

between the two elements, or the two elements may be "connected," "coupled," or "adhered" to each other through the other element(s).

In the present disclosure, examples of a "display apparatus" may include, in a narrow sense, a display panel and a driver for driving the display panel, such as a liquid crystal module (LCM), an organic light emitting module (OLED module), and a quantum dot module (QD module). Further, other examples of a "display apparatus" may include a set electronic device or a set device (or a set apparatus) which is a complete product or a final product incorporating an LCM, an OLED module, or a QD module, such as a notebook, laptop, or portable computer, a television, a computer monitor, an equipment apparatus including an automotive display apparatus or another type of apparatus for vehicles, or a mobile electronic device, such as a smartphone or an electronic pad.

Accordingly, in the present disclosure, examples of the display apparatus may include not only a display apparatus itself in a narrow sense, such as an LCM, an OLED module, or a QD module, but also an applied product or a set apparatus which is a final consumer device incorporating the LCM, the OLED module, the QD module, or the like.

Further, in some embodiments, the LCM, the OLED module, or the QD module which is configured with a display panel and a driver may be referred to as "a display apparatus" in a narrow sense, and an electronic device as a complete product incorporating an LCM, OLED module, or QD module may be referred to as a "set apparatus." For example, the display apparatus in the narrow sense may include a display panel, such as a liquid crystal (LCD) display panel, an OLED display panel, or a quantum dot display panel, and a source PCB which is a controller for driving the display panel. In contrast, the set device may further include a set PCB which is a set controller electrically connected to the source PCB to control the entire set device.

A display panel according to example embodiments of the present disclosure may be any type of display panel, such as a liquid crystal (LCD) display panel, an organic light emitting diode (OLED) display panel, a quantum dot (QD) display panel, and an electroluminescent display panel. However, the display panel according to example embodiments of the present disclosure is not limited to a specific display panel, for example, an OLED display panel capable of being bent at a bezel, with a flexible substrate for the OLED display panel and a lower back-plate support structure. Further, the display panel according to example embodiments of the present disclosure is not limited to a particular shape or size of the display panel.

For example, if the display panel is an OLED display panel, the display panel may include a plurality of gate lines and a plurality of data lines, and pixels formed at the intersections of the gate lines and the data lines. Further, the display panel may be configured to include an array including a thin film transistor which is an element to selectively apply a voltage to each pixel, an organic light emitting diode (OLED) layer on the array, and an encapsulation substrate or an encapsulation layer disposed on the array to cover the organic light emitting diode layer. The encapsulation layer may protect the thin film transistor and the organic light emitting diode layer from external impacts and suppress the permeation of moisture or oxygen into the organic light emitting diode layer. Further, a layer formed on the array may include an inorganic light emitting layer, for example, a nano-sized material layer, quantum dots, or the like.

In the present specification, FIG. 1 illustrates an example organic electroluminescent (OLED) display panel which may be integrated in various types of display apparatuses.

FIG. 1 is a plan view illustrating a display apparatus according to an example embodiment of the present disclosure. As shown in FIG. 1, the display apparatus may include a substrate SUB, a pixel P, a pixel array layer 120, a touch electrode layer 150, a common power line CPL, a dam structure DM, and drivers. The drivers may include a pad part PP, a gate driving circuit 200, and a driving integrated circuit 300.

The substrate SUB may be a base substrate (or a base layer) and may include a plastic material or a glass material. Specifically, in the case of a foldable display apparatus, the substrate may be formed of a plastic material having an excellent flexibility. However, even though the substrate is formed of a glass material, the substrate may be formed to be ultra-thin to implement a foldable display apparatus.

The substrate SUB according to an example embodiment may have a quadrangular shape in plan view, a quadrangular shape with rounded corners having a predetermined radius of curvature, or a non-quadrangular shape having at least six sides. Here, the substrate SUB having a non-quadrangular shape may, for example, include at least one protrusion portion or at least one notch portion.

The substrate SUB according to an example embodiment may be divided into a display area AA and a non-display area IA. The display area AA may be provided in a center area of the substrate SUB and may be defined as an area in which images are displayed. The display area AA according to an example embodiment may have a quadrangular shape in plan view, a quadrangular shape with rounded corners having a predetermined radius of curvature, or a non-quadrangular shape having at least six sides. Here, the display area AA having a non-quadrangular shape may, for example, include at least one protrusion portion or at least one notch portion.

The non-display area IA may be provided at an edge area of the substrate SUB so as to surround the display area AA and may be defined as an area in which the image is not displayed or as a peripheral area. The non-display area IA according to an example embodiment may include a first non-display area IA1 provided at a first edge of the substrate SUB, a second non-display area IA2 provided at a second edge of the substrate SUB parallel to the first non-display area IA1, a third non-display area IA3 provided at a third edge of the substrate SUB, and a fourth non-display area IA4 provided at a fourth edge of the substrate SUB parallel to the third non-display area IA3. For example, the first non-display area IA1 may be a lower edge area of the substrate SUB, the second non-display area IA2 may be an upper edge area of the substrate SUB, the third non-display area IA3 may be a left edge area of the substrate SUB, and the fourth non-display area IA4 may be a right edge area of the substrate SUB. However, the present disclosure is not limited to this example.

The pixel P may be provided on the display area AA of the substrate SUB. A plurality of pixels P according to example embodiment may form a matrix and may be disposed in the display area AA of the substrate SUB. The pixel P may be defined by a scan line SL, a data line DL, and a pixel driving power line PL.

As shown in FIG. 1, the scan lines SL may extend along a first direction X and may be disposed at a predetermined interval along a second direction Y intersecting the first direction X. The display area AA of the substrate SUB may include a plurality of scan lines SL which is parallel to the first direction X and is spaced apart from each other along the second direction Y. Here, the first direction X may be defined as a horizontal direction of the substrate SUB, and the second direction Y may be defined as a vertical direction of the substrate SUB.

The data lines DL may extend along the second direction Y and may be disposed at a predetermined interval along the first direction X. The display area AA of the substrate SUB may include a plurality of data lines DL which is parallel to the second direction Y and is spaced apart from each other along the first direction X.

The pixel driving power lines PL may be disposed on the substrate SUB to be parallel to the data lines DL. The display area AA of the substrate SUB may include a plurality of pixel driving power lines PL parallel to the data lines DL. Alternatively, the pixel driving power lines PL may be disposed to be parallel to the scan lines SL.

The pixel P according to an example embodiment may be disposed on the display area AA to have a stripe structure. In this case, one unit pixel may, for example, include a red pixel, a green pixel, and a blue pixel. In another example, one unit pixel may additionally include a white pixel.

A pixel P according to another example embodiment may be disposed on the display area AA to have a pentile structure. In this case, one unit pixel may include at least one red pixel, at least two green pixels, and at least one blue pixel disposed with a polygonal shape in plan view. For example, one unit pixel having a pentile structure may be configured such that one red pixel, two green pixels, and one blue pixel are disposed to have an octagonal shape in plan view. In this case, the blue pixel may have the largest opening area (or an emission area) among the pixels, and the green pixel may have the smallest opening area.

The pixel P may include a pixel circuit PC electrically connected to the scan line SL, the data line DL, and the pixel driving power line PL and may also include a light emitting diode ED electrically connected to the pixel circuit PC.

The pixel circuit PC may control a current Ied flowing to the light emitting diode ED from the pixel driving power line PL, based on a data voltage supplied from an adjacent data line DL and a scan signal supplied from at least one adjacent scan line SL.

The pixel circuit PC according to an example embodiment may include at least two thin film transistors and one capacitor. For example, an example pixel circuit PC may include a driving thin film transistor, a switching thin film transistor, and a capacitor. The driving thin film transistor may supply a data current Ied based on the data voltage to the light emitting diode ED. The switching thin film transistor may supply a data voltage supplied from the data line DL to the driving thin film transistor. The capacitor may store a gate-source voltage of the driving thin film transistor.

The pixel circuit PC according to another example may include at least three thin film transistors and at least one capacitor. For example, the pixel circuit PC according to this example may include a current supply circuit, a data supply circuit, and a compensation circuit in accordance with an operation (or a function) of each of at least three thin film transistors. Here, the current supply circuit may include a driving thin film transistor for supplying a data current Ied based on the data voltage to the light emitting diode ED. The data supply circuit may include at least one switching thin film transistor for supplying a data voltage supplied from the data line DL to the current supply circuit in response to at least one scan signal. The compensation circuit may include at least one compensation thin film transistor for compensating for a variation of a characteristic value (a threshold voltage and/or a mobility) of the driving thin film transistor in response to at least one scan signal.

The light emitting diode ED may emit light with a luminance based on the data current Ied supplied from the pixel circuit PC. In this case, the data current Ied may flow to a common power line CPL from the pixel driving power line PL via the driving thin film transistor and the light emitting diode ED.

The light emitting diode ED according to one example may include a pixel driving electrode (or a first electrode or an anode) electrically connected to the pixel circuit PC, an emission layer formed on the pixel driving electrode, and a common electrode (or a second electrode or a cathode CE) electrically connected to the emission layer.

The common power line CPL may be disposed on the non-display area IA of the substrate SUB and may be electrically connected to the common electrode CE disposed on the display area AA. The common power line CPL according to an example embodiment may have a predetermined line width. The common power line CPL may start from a pad portion PP disposed in the first non-display area IA1 of the substrate SUB and extend around at least three sides of the display area AA, turning and extending into the third non-display area IA3, then the second non-display area IA2, then the fourth non-display area IA4, and then the first non-display area IA1 again to be connected to the pad portion PP disposed in the first non-display area IA1. This example common power line CPL is not disposed at a center portion of the first non-display area IA1 so that the common power line CPL according to one example is not formed in at least a portion of the lower side of the display area AA of the substrate SUB in plan view to have an inverse U shape with one open side.

The pixels P may be formed by laminating a plurality of thin film layers. The pixel array layer 120 may include thin film layers with which components included in the pixel P may be formed. A detailed structure of an example pixel array layer 120 will be described below with reference to FIG. 2.

Even though not illustrated in FIG. 1, an encapsulation layer may be laminated on the pixel array layer 120. The encapsulation layer may be formed on the substrate SUB to enclose the display area AA and an upper surface and a side surface of the common power line CPL.

The encapsulation layer may suppress oxygen or moisture from permeating into the light emitting diode ED provided in the display area AA. The encapsulation layer according to an example embodiment of the present disclosure may include at least one inorganic layer. An encapsulation layer according to another example embodiment may include a plurality of inorganic layers and at least one organic layer between the plurality of inorganic layers.

The touch electrode layer 150 may be formed directly on the encapsulation layer. To this end, before forming the touch electrode layer 150, an upper protective layer may be formed on the encapsulation layer in advance. The structure of the touch electrode layer 150 may vary depending on whether the touch function is configured as a self-capacitance type or a mutual capacitance type. For example, in the case of the self-capacitance type, the touch electrode layer may include a wiring layer, an insulating layer, and an electrode layer. As another example, in the case of the mutual capacitance type, the touch electrode layer may include a first electrode layer, an insulating layer, and a second electrode layer.

The electroluminescent display apparatus according to an example embodiment of the present disclosure may further include a pad portion PP, a gate driving circuit 200, a driving integrated circuit 300, and a touch inspection portion TEP.

The pad portion PP may include a plurality of pads provided in the non-display area IA of the substrate SUB. The pad portion PP according to an example embodiment may include a plurality of common power supply pads, a plurality of data input pads, a plurality of power supply pads, a plurality of control signal input pads, and the like, provided in the first non-display area IA1.

The gate driving circuit 200 may be provided in the third non-display area IA3 and/or the fourth non-display area IA4 of the substrate SUB to be connected to the scan lines SL provided in the display area AA one to one. The gate driving circuit 200 may be integrated in the third non-display area IA3 and/or the fourth non-display area IA4 of the substrate SUB during a pixel (P) manufacturing process, that is, a thin film transistor manufacturing process. The gate driving circuit 200 may generate a scan signal based on the gate control signal supplied from the driving integrated circuit 300 to output the scan signal in accordance with a determined order to drive the plurality of scan lines SL in accordance with the determined order.

The gate driving circuit 200 according to an example embodiment may include a shift register.

The dam structure DM may be provided in the first non-display area IA1, the second non-display area IA2, the third non-display area IA3, and the fourth non-display area IA4 of the substrate SUB to have a closed-curve structure enclosing a periphery of the display area AA. For example, the dam structure DM may be disposed at the outside of the common power line CPL to be located at an outermost peripheral portion on the substrate SUB. The pad portion PP and the driving integrated circuit 300 may be disposed at an outer side of the dam structure DM, that is, at the other side of the dam structure from the display area AA.

Even though the dam structure DM is illustrated in FIG. 1 to be disposed at the outermost periphery, it is not limited thereto. As another example, the dam structure DM may be disposed between the common power line CPL and the gate driving circuit 200. As yet another example, the dam structure DM may be disposed between the display area AA and the gate driving circuit 200.

The driving integrated circuit 300 may be mounted in a chip mounting area defined in the first non-display area IA1 of the substrate SUB by a chip mounting (or bonding) process. Input terminals of the driving integrated circuit 300 may be electrically connected to the pad portion PP. The input terminals of the driving integrated circuit 300 may be electrically connected to the plurality of data lines DL and the plurality of pixel driving power lines PL provided in the display area AA. The driving integrated circuit 300 may receive various power inputs, timing synchronization signals, and digital image data input from the display driving circuit (or a host circuit) via the pad portion PP. The driving integrated circuit 300 may generate a gate control signal in accordance with the timing synchronization signals to control the driving of the gate driving circuit 200. Simultaneously, the driving integrated circuit 300 may convert the digital image data into an analog pixel data voltage to supply the analog pixel data voltage to a corresponding data line DL.

The touch inspection portion TEP may be disposed in the first non-display area IA1. The touch inspection portion TEP may include a touch inspection switch TES, a touch inspection control switch TECS, and a touch pad TP. The touch inspection switch TES may be connected to the touch electrode layer 150. The touch inspection portion TEP may be disposed on both left and right sides of the first non-display area IA1 as needed or desired. If the touch inspection portions are disposed at a plurality of positions, the touch pad TP may be omitted in any one touch inspection portions TEP.

Figure 2:
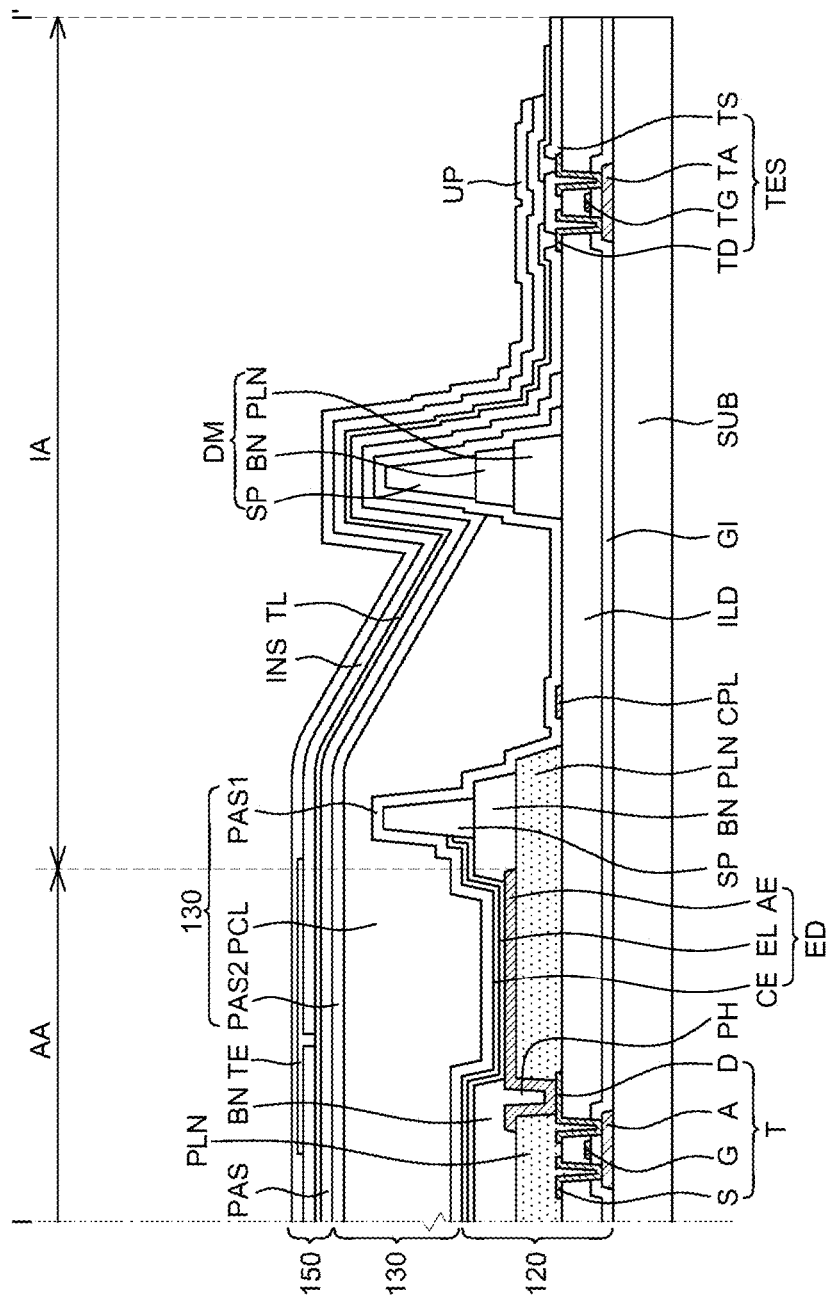
FIG. 2 is a cross-sectional view of an example embodiment taken along the line I-I' of FIG. 1.

FIG. 2 is a cross-sectional view taken along the line I-I' of FIG. 1. The electroluminescent display apparatus according to an example embodiment of the present disclosure may include a substrate SUB, a pixel array layer 120, a spacer SP, an encapsulation layer 130, a dam structure DM, a touch electrode layer 150, a touch switching element TES, and an inspection pad TP (see FIG. 1). Even though not illustrated in FIG. 2, the example electroluminescent display apparatus may further include an array switching element TAP, a first active signal pad E1, and a second active signal pad E2, which are not illustrated in the cross-sectional view.

The substrate SUB may be a base layer and may include a plastic material or a glass material. The substrate SUB according to an example embodiment may include an opaque or colored polyimide material. For example, the substrate SUB formed of a polyimide material may be formed by hardening a polyimide resin coated with a predetermined thickness on a front surface of a release layer provided on a carrier substrate with a relatively large thickness. In this case, the carrier glass substrate may be separated from the substrate SUB by releasing the release layer using a laser release process. The example substrate SUB may further include a back plate coupled to a rear surface of the substrate SUB with respect to a thickness direction Z. The back plate may maintain the substrate SUB to be flat.

The back plate according to an example embodiment may include a plastic material and, for example, may include a polyethylene terephthalate material. The back plate may be laminated on a rear surface of the substrate SUB which has been separated from the carrier glass substrate.

The substrate SUB according to another example may be a flexible glass substrate. For example, the substrate SUB formed of a glass material may be a thin glass substrate having a thickness of 100 micrometers or smaller or may be a carrier glass substrate etched by a substrate etching process to have a thickness of 100 micrometers or smaller.

Preferably, the substrate SUB may be a material having an excellent flexibility to be freely folded or unfolded. The substrate SUB may include a display area AA and a non-display area IA surrounding the display area AA.

A buffer layer (not illustrated) may be formed on an upper surface of the substrate SUB. The buffer layer may be formed on a surface of the substrate SUB to block moisture from permeating into the pixel array layer 120 through the substrate SUB, which may be vulnerable to the moisture permeation. The buffer layer according to an example embodiment may be formed with a plurality of alternately laminated inorganic layers. For example, the buffer layer may have a multi-layer structure formed by alternately laminating one or more inorganic layers of a silicon oxide layer SiOx, a silicon nitride layer SiNx, and a silicon oxy nitride layer SiON. The buffer layer may be omitted in some embodiments of the present disclosure.

The pixel array layer 120 may include a thin film transistor layer, a planarization layer PLN, a bank pattern BN, and a light emitting diode ED.

The thin film transistor layer may be provided in the plurality of pixels P defined in the display area AA of the substrate SUB and in the gate driving circuit 200 defined in the third and fourth non-display areas IA3 and IA4 of the substrate SUB.

The thin film transistor layer according to an example embodiment may include a thin film transistor T, a gate insulating layer GI, and an interlayer insulating layer ILD. Here, the example thin film transistor T illustrated in FIG. 2 may be a driving thin film transistor electrically connected to the light emitting diode ED.

The thin film transistor T may include a semiconductor layer A, a gate electrode G, a source electrode S, and a drain electrode D formed on the substrate SUB or on the buffer layer (not illustrated) on the substrate SUB. In FIG. 2, a top gate type thin film transistor T in which the gate electrode G is located above the semiconductor layer A has been illustrated, but the thin film transistor T is not limited thereto.

As another example, the thin film transistor T may have a bottom gate structure in which the gate electrode G is located below the semiconductor layer A or have a double gate structure in which the gate electrode G is disposed above and below the semiconductor layer A.

The semiconductor layer A may be formed on the substrate SUB or on the buffer layer. The semiconductor layer A may include a silicon-based semiconductor material, an oxide-based semiconductor material, or an organic-based semiconductor material. The semiconductor layer A may have a single layered structure or a double layered structure. A light shielding layer for blocking external light incident on the semiconductor layer A may be additionally formed between the buffer layer and the semiconductor layer A.

The gate insulating layer GI may be formed on the entire substrate SUB to cover the semiconductor layer A. The gate insulating layer GI may be formed of an inorganic layer, for example, a silicon oxide film SiOx or a silicon nitride film SiNx, or of a plurality of such inorganic layers.

The gate electrode G may be formed on the gate insulating layer GI to overlap the semiconductor layer A. The gate electrode G may be formed together with the scan line SL. The gate electrode G according to an example embodiment of the present disclosure may be formed as a single layer or a multi-layer of one or more of molybdenum (Mo), aluminum (Al), chrome (Cr), gold (Au), titanium (Ti), nickel (Ni), neodymium (Nd), and copper (Cu), or any alloy thereof.

The interlayer insulating layer ILD may be formed on the entire substrate SUB to cover the gate electrode G and the gate insulating layer GI. The interlayer insulating layer ILD may provide a flat surface over the gate electrode G and the gate insulating layer GI.

The source electrode S and the drain electrode D may be formed on the interlayer insulating layer ILD to overlap the semiconductor layer A with the gate electrode G therebetween. The source electrode S and the drain electrode D may be formed together with the data line DL, the pixel driving power line PL, and the common power line CPL. That is, the source electrode S, the drain electrode D, the data line DL, the pixel driving power line PL, and the common power line CPL may be simultaneously formed by a patterning process on a source and drain electrode material.

The source electrode S and the drain electrode D may be connected to the semiconductor layer A by means of an electrode contact hole which passes through the interlayer insulating layer ILD and the gate insulating layer GI. The source electrode S and the drain electrode D may be formed as a single layer or a multi-layer of one or more of molybdenum (Mo), aluminum (Al), chrome (Cr), gold (Au), titanium (Ti), nickel (Ni), neodymium (Nd), and copper (Cu), or any alloy thereof. The source electrode S of the thin film transistor T may be electrically connected to the pixel driving power line PL.

As described above, the thin film transistor T provided in the pixel P of the substrate SUB may configure the pixel circuit PC. Further, the gate driving circuit 200 provided in the third and fourth non-display areas IA3 and IA4 of the substrate SUB may include a thin film transistor having the same or similar configuration as the thin film transistor T provided in the pixel P.

The planarization layer PLN may be formed on the entire substrate SUB to cover the thin film transistor layer. The planarization layer PLN may provide a flat surface over the thin film transistor layer. The planarization layer PLN according to an example embodiment may be formed of an organic layer, such as an acryl resin, an epoxy resin, a phenolic resin, a polyamide resin, or a polyimide resin.

Another example planarization layer PLN may include a pixel contact hole PH to expose the drain electrode D of the driving thin film transistor provided in the pixel P.

The bank BN may be disposed on the planarization layer PLN to define an opening area (or an emission area) in the pixel P of the display area AA. Such a bank BN may also be referred to as a pixel definition layer.

The light emitting diode ED may include an anode electrode AE, an emission layer EL, and a cathode electrode CE. The anode electrode AE may be formed on the planarization layer PLN and be electrically connected to the drain electrode D of the driving thin film transistor via the pixel contact hole PH provided in the planarization layer PLN. In this case, an edge portion, excluding a center portion of the anode electrode AE overlapping the opening area of the pixel P, may be covered by the bank BN. The bank BN may cover an edge portion of the anode electrode AE to define an opening area of the pixel P.

The anode electrode AE according to an example embodiment may include a metal material having a high reflectance. For example, the anode electrode AE may be formed with a multilayered structure, such as a lamination structure (Ti/Al/Ti) of aluminum (Al) and titanium (Ti), a lamination structure (ITO/Al/ITO) of aluminum (Al) and ITO, APC alloy (Ag/Pd/Cu), a lamination structure (ITO/APC/ITO) of the APC alloy and ITO. Alternatively, the anode electrode AE may have a single layer structure having one of silver (Ag), aluminum (Al), molybdenum (Mo), gold (Au), magnesium (Mg), calcium (Ca), and barium (Ba) or having an alloy material of two or more of them.

The emission layer EL may be formed on the entire display area AA of the substrate SUB to cover the anode electrode AE and the bank BN. To emit white light, the emission layer EL according to an example embodiment of the present disclosure may include two or more light emitting units which are vertically laminated. For example, the example emission layer EL may include a first light emitting unit and a second light emitting unit to emit white light by mixing first light and second light. Here, the first light emitting unit may emit first light and may include any one of a blue light emitting unit, a green light emitting unit, a red light emitting unit, a yellow light emitting unit, and a yellowish green light emitting unit. The second light emitting unit may include a light emitting unit emitting second light for optically compensating for the first light, among the blue light emitting unit, the green light emitting unit, the red light emitting unit, the yellow light emitting unit, and the yellowish green light emitting unit.

An emission layer EL according to another example embodiment may include any one of a blue light emitting unit, a green light emitting unit, and a red light emitting unit to emit color light corresponding to a color set in the pixel P. For example, the emission layer EL according to another example may include one of an organic light emitting layer, an inorganic light emitting layer, and a quantum dot light emitting layer or include a laminated or mixed structure of an organic light emitting layer (or an inorganic light emitting layer) and the quantum dot light emitting layer.

Additionally, the light emitting diode ED according to an example embodiment may further include a functional layer to improve a luminous efficiency and/or a lifespan of the light emitting layer EL.

The cathode electrode CE may be formed to be electrically connected to the light emitting layer EL. The cathode electrode CE may be formed in the entire display area AA of the substrate SUB to be commonly connected to the emission layer EL provided in each pixel P.

The cathode electrode CE according to an example embodiment of the present disclosure may include a transparent conductive material or a transflective conductive material which transmits light. If the cathode electrode CE is formed of a transflective conductive material, a light emission efficiency of light emitted from the light emitting diode ED may be increased by a micro cavity structure. The transflective conductive material according to an example embodiment may include magnesium (Mg), silver (Ag), an alloy of magnesium (Mg) and silver (Ag), or the like. Additionally, a capping layer for improving a light emission efficiency by adjusting a refractive index of the light emitted from the light emitting diode ED may be additionally formed on the cathode electrode CE.

A spacer SP may be scattered throughout the display area AA and be disposed between adjacent opening areas, that is, in areas in which the light emitting diode ED is not disposed. The spacer SP may be provided to suppress the direct contact between a screen mask and the substrate during a process of depositing the emission layer EL. The spacer SP may be disposed on the bank BN with a pillar shape and be partially scattered. Even though the emission layer EL and the cathode electrode CE as illustrated do not pass over the spacer SP, the emission layer EL and the cathode electrode CE are not necessarily disconnected by the spacer SP. Instead, they may be connected on the entire substrate SUB. The spacer SP may have a tapered shape or a reverse tapered shape so that the emission layer EL and the cathode electrode CE are not disconnected by the spacer SP.

The encapsulation layer 130 may be formed to enclose both a top surface and a side surface of the pixel array layer 120. The encapsulation layer 130 may suppress the permeation of oxygen or moisture into the light emitting diode ED.

The encapsulation layer 130 according to an example embodiment may include a first inorganic encapsulation layer PAS1, an organic encapsulation layer PCL on the first inorganic encapsulation layer PAS1, and a second inorganic encapsulation layer PAS2 on the organic encapsulation layer PCL. The first inorganic encapsulation layer PAS1 and the second inorganic encapsulation layer PAS2 may block the permeation of moisture or oxygen. The first inorganic encapsulation layer PAS1 and the second inorganic encapsulation layer PAS2 may be formed of an inorganic material, such as silicon nitride, aluminum nitride, zirconium nitride, titanium nitride, hafnium nitride, tantalum nitride, silicon oxide, aluminum oxide, or titanium nitride. The first inorganic encapsulation layer PAS1 and the second inorganic encapsulation layer PAS2 may be formed by a chemical vapor deposition process or an atomic layer deposition process.

The organic encapsulation layer PCL may be enclosed by the first inorganic encapsulation layer PAS1 and the second inorganic encapsulation layer PAS2. The organic encapsulation layer PCL may be formed with a thickness larger than that of the first inorganic encapsulation layer PAS1 and/or the second inorganic encapsulation layer PAS2 to absorb and/or block particles which may be generated during the manufacturing process. The organic encapsulation layer PCL may be formed of an organic material, such as silicon oxy carbon (SiOCz), an acryl or epoxy-based resin. The organic encapsulation layer PCL may be formed by a coating process, such as an inkjet coating process or a slit coating process.

The electroluminescent display apparatus according to an exemplary embodiment of the present disclosure may further include a dam structure DM. The dam structure DM may be disposed in the non-display area IA of the substrate SUB to suppress the overflowing of the organic encapsulation layer PCL.

The dam structure DM according to an example embodiment may be disposed outside the display area AA toward the periphery of the substrate SUB from the display area AA, from the gate driving circuit 200 disposed outside of the display area AA, and from the common power line CPL disposed outside of the gate driving circuit 200. In some example embodiments, the dam structure DM may be disposed to overlap an outside portion of the common power line CPL or the gate driving circuit 200. In this case, the width of the non-display area IA in which the gate driving circuit 200 and the common power line CPL are disposed may be reduced to reduce a bezel width.

The dam structure DM according to an example embodiment of the present disclosure may have a triple-layered structure formed to be perpendicular to the substrate SUB. For example, the dam structure DM may include a first layer formed of the planarization layer PLN, a second layer formed of the bank pattern BN, and a third layer formed of the spacer SP.

The first layer may have a trapezoidal cross-sectional structure by patterning the planarization layer PLN. The second layer may have a trapezoidal cross-sectional structure laminated on the first layer. The third layer may have a trapezoidal cross-sectional structure laminated on the second layer. If the organic encapsulation layer PCL has a small thickness, for example, for an easier control of the spreadability of the organic encapsulation layer PCL, a low height of the dam structure DM may be sufficient. In this case, the third layer may be omitted.

The dam structure DM may be covered by either or both the first inorganic encapsulation layer PAS1 and the second inorganic encapsulation layer PAS2. The organic encapsulation layer PCL may be in contact with a part of an inner wall surface of the dam structure DM. For example, a height of the organic encapsulation layer PCL (from a bottom surface to an upper surface) at an edge area next to the dam structure DM may be greater than the height of the first layer (PLN) of the dam structure DM but smaller than the combined height of the first layer (PLN) and the second layer (BN). Alternatively, this height of the organic encapsulation layer PCL at the edge area next to the dam structure DM may be greater than the combined height of the first and second layers (PLN and BN) of the dam structure DM but smaller than the combined height of the first, second, and third layers (PLN, BN, and SP).

The organic encapsulation layer PCL is preferably formed so that its height at the edge area next to the dam structure DM may be smaller than the overall height of the dam structure DM. As a result, the first inorganic encapsulation layer PAS1 and the second inorganic encapsulation layer PAS2 may have their respective surfaces contact each other on the upper surface and the outer side wall of the dam structure DM.

An upper protective layer PAS may be provided on the second inorganic encapsulation layer PAS2 at the top of the encapsulation layer 130. The upper protective layer PAS may be a protective layer laminated on the second inorganic encapsulation layer PAS2 to protect element layers therebelow when a touch electrode layer 150 formed thereon is patterned.

The touch electrode layer 150 may be laminated on the upper protective layer PAS. The touch electrode layer 150 may include a touch line TL, an insulating layer INS, a touch electrode TE, and a touch protective layer UP.

The touch line TL may include a transparent conductive material and may extend from the display area AA to the first non-display area IA1. Specifically, the touch line TL may be connected to the touch inspection portion TEP disposed in the first non-display area IA1 (see FIG. 1).

The touch inspection portion TEP may include a touch inspection switch TES, a touch inspection control switch TECS, and a touch pad TP, as shown in FIG. 1. Of these elements, only the touch inspection switch TES is illustrated in the cross-sectional view of FIG. 2. One end of the touch inspection switch TES may be connected to the touch electrode TE, and the other end may be connected to wiring lines for a driving signal connected to the driving circuit 200.

The touch inspection switch TES may have the same or similar configuration as the thin film transistor T formed in the display area AA. For example, the touch inspection switch TES may include a touch gate electrode TG, a touch semiconductor layer TA, a touch source electrode TS, and a touch drain electrode TD. The touch line TL may be connected to the touch drain electrode TD.

The touch inspection switch TES may be covered by the first inorganic encapsulation layer PAS1 and the second inorganic encapsulation layer PAS2 of the encapsulation layer 130 and by the upper protective layer PAS. In FIG. 2, for convenience, only the upper protective layer PAS among these three layers is illustrated as covering the touch inspection switch TES.

The touch line TL may be connected to the touch drain electrode TD through a contact hole (e.g., in the protective layer PAS) which exposes a drain electrode TD of the touch inspection switch TES.

As described above, the touch source electrode TS of the touch inspection switch TES may be connected to the wiring lines for the gate driving circuit 200. The wiring lines for the gate driving circuit 200, for example, may include various wiring lines, such as a gate high voltage line VGH, a gate low voltage line VGL, an EM driver start line EVST, an EM driver clock line ECLK, a first scan driver start line G1VST, and a first scan driver clock line G1CLK.

The touch gate electrode TG may be connected to the touch inspection control switch TECS (see, e.g., FIG. 1). When an on/off signal of the touch inspection control switch TECS is applied to the touch gate electrode TG, the touch inspection switch TES may also be turned on/off.

The connection between the touch source electrode TS and the wiring lines for the gate driving circuit 200 and the connection between the touch gate electrode TG and the touch inspection control switch TECS will be described in more detail with reference to FIG. 3.

The insulating layer INS may be laminated on the touch line TL to cover the entire surface of the substrate SUB.

The touch electrode TE may be formed on the insulating layer INS. The touch electrode TE may be disposed in the display area AA. For example, one touch electrode TE may be formed to cover approximately 9 to 16 pixel areas. One touch electrode TE may be connected to one touch line TL. For example, the touch line TL and the touch electrode TE may be connected via a contact hole which passes through the insulating layer INS to expose a part of the touch line TL.

The touch protective layer UP may be laminated on an upper surface of the touch electrode TE and the insulating layer INS to cover the entire surface of the substrate SUB. Here, the touch protective layer UP may expose a part of the inspection pad TP.

Figure 3:
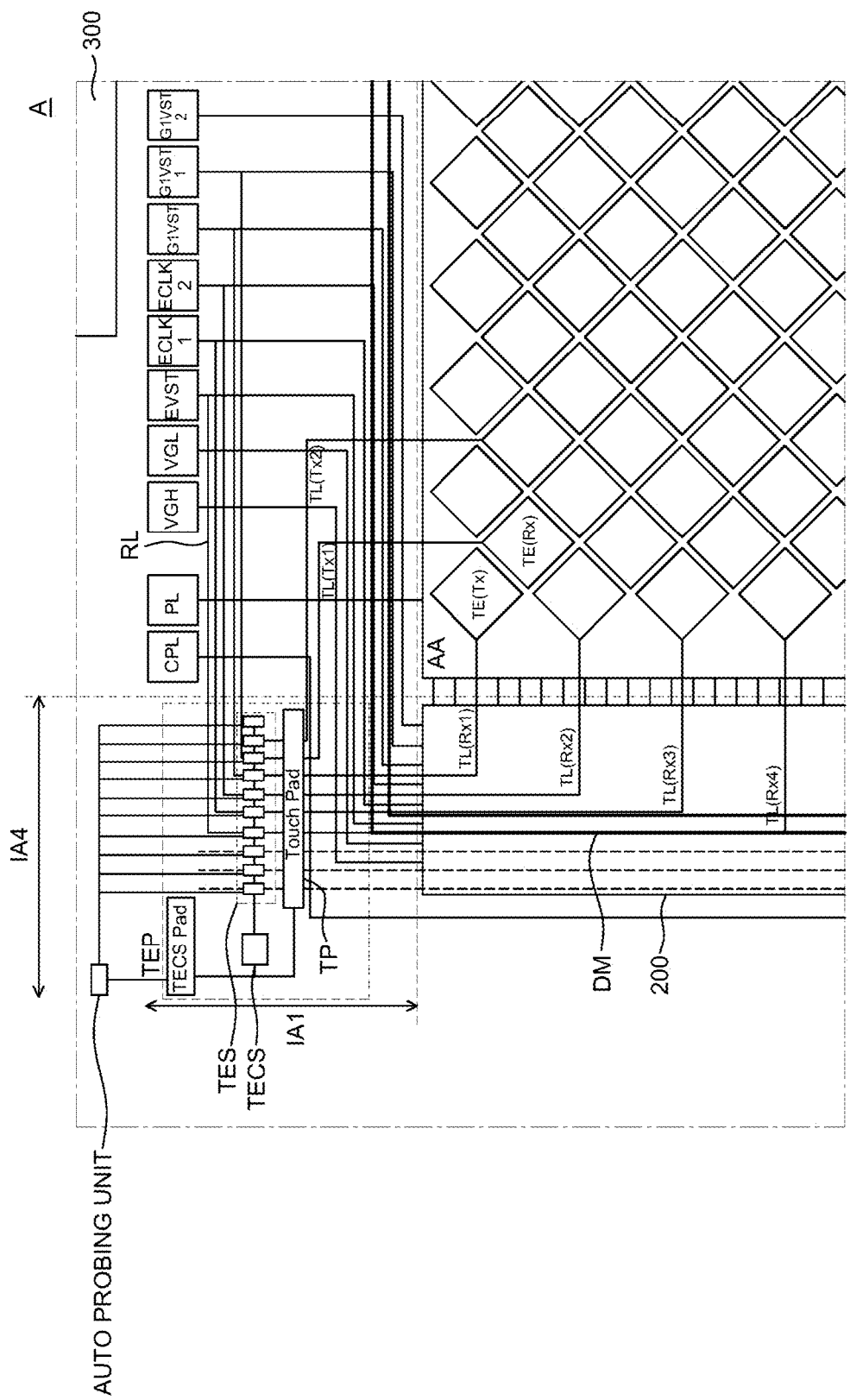
FIG. 3 is a plan view of an example embodiment obtained by enlarging region A of FIG. 1.

FIG. 3 is a plan view schematically illustrating a connection relationship of the touch inspection portion TEP and the gate driving circuit 200 by enlarging a region A of FIG. 1. As shown in FIG. 3, the touch electrodes TE may be disposed in the display area AA. The touch electrodes TE may include Tx electrodes Tx and Rx electrodes Rx. The touch electrodes TE may be configured with the Tx electrodes Tx and the Rx electrodes Rx so that a touch position may be more easily and accurately determined or checked when a touch point of the screen is measured in X-Y coordinates. A touch electrode TE may be formed of a transparent electrode or a transflective electrode. If the touch electrode TE is formed of the transparent electrode, the touch electrode may be disposed to overlap the plurality of pixels P. Alternatively, if the touch electrode TE is formed of the transflective electrode, the touch electrode may be disposed to overlap the bank (BN) area which does not overlap the plurality of pixels P.

To provide for the touch function in the display area AA, the Tx electrodes Tx of the touch electrodes TE may be disposed in a vertical direction of the display area AA, and the Rx electrodes Rx of the touch electrodes TE may be disposed in a horizontal direction. For example, 15 lines of Tx electrodes Tx may be disposed in the vertical direction, and 33 lines of Rx electrodes Rx may be disposed in the horizontal direction, although the respective numbers of lines and the respective directions of the Tx and Rx electrodes may vary depending on the particular embodiments. The touch electrodes TE may be disposed to have various shapes. In FIG. 3, for example, rhombus shaped touch electrodes TE are illustrated, but the present disclosure is not limited to this shape of touch electrodes TE.

In the first non-display area IA1 of the substrate SUB, various wiring lines, such as a common power line CPL and a pixel driving power line PL for driving the pixel, a gate high voltage line VGH and a gate low voltage line VGL, an EM driver start line EVST, EM driver clock lines ECLK, a first scan driver start line G1VST, and a first scan driver clock line G1CLK for operating the gate driving circuit 200. Pad portions PP for the wiring lines may also be disposed in the first non-display area IA1. Further, the touch inspection portion TEP may be disposed in the first non-display area IA1 or the fourth non-display area IA4.

The pixel driving power line PL and the common power line CPL may be disposed in the first non-display area IA1. The pixel driving power line PL may be connected to the pixel circuit PC of the display area AA. The common power line CPL may extend to the fourth non-display area IA4, the second non-display area IA2, and the third non-display area IA3 from the first non-active area IA1 to be connected to the cathode electrode CE of the pixel P.

The touch inspection portion TEP may include a touch inspection switch TES, a touch inspection control switch TECS, a touch pad TP, and a touch inspection control switch driving pad TECS Pad. As shown in FIG. 3, reference lines RL split from the wiring lines for the gate driving circuit 200, such as a gate high voltage line VGH, a gate low voltage line VGL, an EM driver start line EVST, an EM driver clock line ECLK, a first scan driver start line G1VST, and a first scan driver clock line G1CLK, may be connected to the plurality of touch inspection switches TES. The reference lines RL connected to the plurality of touch inspection switches TES may pass through the touch inspection switches TES to be connected respectively to the corresponding touch lines TL. However, when the touch inspection switches TES are not turned on, the lines may not be electrically connected. A touch line TL connected by passing through the corresponding touch inspection switch TES may be connected to the corresponding Tx electrode Tx or Rx electrode Rx. A touch line TL connected to the corresponding Rx electrode Rx may be disposed above the gate driving circuit 200 to overlap the gate driving circuit 200.

For performing the auto probe inspection, if an auto probing unit is connected to apply power to a pad connected to a plurality of wiring lines, such as the pixel driving power line PL, the common power line CPL, and the gate high voltage line VGH, the gate low voltage line VGL, the EM driver start line EVST, the EM driver clock line ECLK, the first scan driver start line G1VST, and the first scan driver clock line G1CLK for operating the gate driving circuit 200, it is possible to check whether the pixels P of the display area AA operate normally. In this case, a terminal of the auto probing unit may additionally be connected to the touch inspection control switch driving pad TECS Pad to perform a touch line short inspection after the pixel P operation inspection. When an electrical signal is input to the touch inspection control switch driving pad TECS Pad, the touch inspection control switch TECS may be switched on to send an "On" signal to the gates TG of the touch inspection switches TES. When all the touch inspection switches TES are turned on, signals supplied to the gate high voltage line VGH, the gate low voltage line VGL, the EM driver start line EVST, the EM driver clock line ECLK, the first scan driver start line G1VST, and the first scan driver clock line G1CLK for operating the gate driving circuit 200 may pass through the touch inspection switches TES via the reference lines RL to flow to the touch lines TL. At this time, if a short is generated between the touch lines TL, an abnormality may be indicated on the display screen, similar to the auto probe inspection method for inspecting operation of the pixels P.

For example, when the electric signal is input to the touch inspection control switch driving pad TECS Pad to turn on the touch inspection control switches TECS to inspect the touch operation after a normal operation is indicated during the pixel (P) driving inspection, if there is no short between the touch lines TL, the display screen may continue to indicate a normal state without being changed. In contrast, if there is a short between the touch lines TL, the wiring lines for operating the gate driving circuit 200 connected with the shorted touch lines TL may be shorted so that a defect may occur. For example, if a first Rx touch line TL(Rx1) and a second Rx touch line TL(Rx2) among the touch lines TL are shorted, the same short circuit phenomenon between the first scan driver start line G1VST and the second EM driver clock line ECLK2 may occur during the auto probe inspection. Therefore, based on this, an auto probe inspection personnel may provide the short circuit between the first Rx touch line TL(Rx1) and the second Rx touch line TL(Rx2) as a feedback to the manufacturing process to resolve the quality problem early.

After the auto probe inspection, a touch pad TP may be connected to the touch driver. The touch driver may be directly connected to the touch pad TP or may alternatively be indirectly connected via a flexible printed circuit board FPCB. The touch driver may transmit a signal by turning off the touch inspection control switches TECS via the touch pad TP to turn off the touch inspection switches TES.

Figure 4:
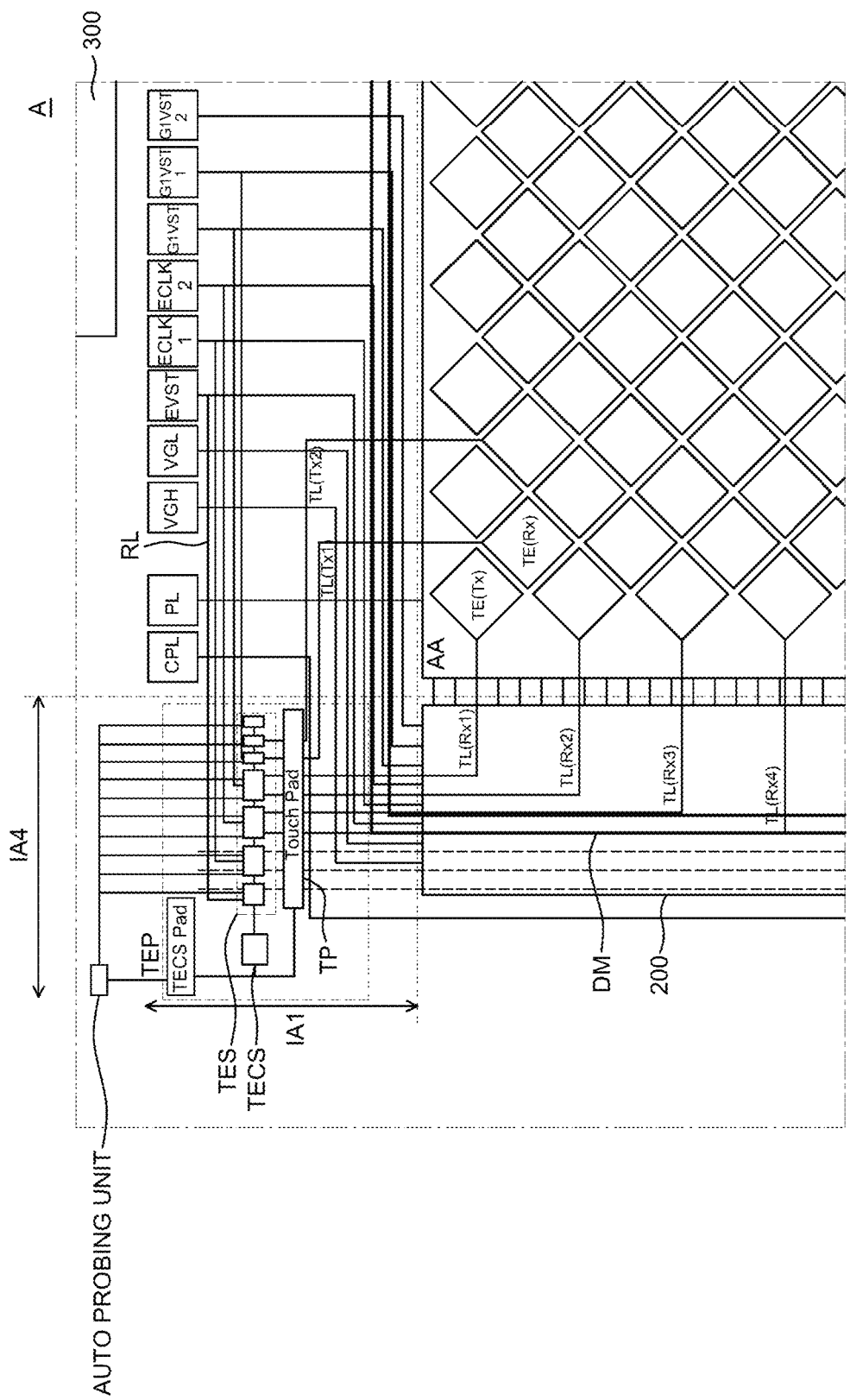
FIG. 4 is a plan view of another example embodiment obtained by enlarging region A of FIG. 1.

FIG. 4 is a plan view illustrating another example embodiment of the present disclosure which is different from the FIG. 3 example and schematically illustrates another example structure of the touch inspection portion TEP, the gate driving circuit 200, and the like by enlarging a region A of FIG. 1. As illustrated in FIG. 4, some of the configurations in the display area AA, the gate driving circuit 200 in the fourth non-display area IA4, and the first non-display area IA1, except for the touch inspection portion TEP, may be the same as those in FIG. 3 so that a detailed description of the same configurations may be omitted. The touch inspection portion TEP illustrated in FIG. 4 is different from that in FIG. 3. The touch inspection portion TEP illustrated in FIG. 4 may include touch inspection switches TES, a touch inspection control switch TECS, a touch pad TP, and a touch inspection control switch driving pad TECS Pad.

An area of at least some of the touch inspection switches TES may be larger than that of the example embodiment of FIG. 3. The gate high voltage line VGH, the gate low voltage line VGL, the EM driver start line EVST, the EM driver clock line ECLK, the first scan driver start line G1VST, and the first scan driver clock line G1CLK for operating the gate driving circuit 200 may be connected to corresponding touch inspection switches TES on a one-to-one basis. However, because at least some of the touch inspection switches TES may have a larger area, a plurality of touch lines TL may be connected to each of these larger touch inspection switches TES. As illustrated in FIG. 4, at least some of the touch inspection switches TES may each be connected to two touch lines TL. This is because a larger number of touch electrodes TE may be disposed in the display area AA for an increased touch sensitivity and because the number of touch lines TL may be increased to correspond to the larger number of touch electrodes TE such that there may be an insufficient number of wiring lines for operating the gate driving circuit 200 for inspecting a short between the touch lines TL via the touch inspection switches TES. Even though the touch inspection switches TES may be disposed as described above, it may still be possible to identify a short circuit between the touch lines TL by the auto probe inspection. For example, if a short circuit occurs between a third Rx touch line TL(Rx3) and a second Rx touch line TL(Rx2) among the touch lines TL, the auto probe inspection may confirm a short between the second EM driver clock line ECLK2 and the first scan driver start line G1VST respectively connected to one side of the corresponding touch inspection switches TES to which TL(Rx3) and TL(Rx2) are respectively connected. Further, as another example, if a short circuit occurs between a first Rx touch line TL(Rx1) and a second Rx touch line TL(Rx2) among the touch lines TL, the auto probe inspection may confirm that the first scan driver start line G1VST connected to one side of the corresponding touch inspection switch TES (to which both TL(Rx1) and TL(Rx2) are connected) is not properly provided.

The display apparatus according to example embodiments of the present disclosure may include a liquid crystal display apparatus (LCD), a field emission display apparatus (FED), an organic light emitting display apparatus (OLED), or a quantum dot display apparatus.

The display apparatus according to example embodiments of the present disclosure may also include a set electronic device or a set device (or a set apparatus), which is a complete product or a final product including an LCM, an OLED module, or a QD module, such as a notebook, laptop, or portable computer, a television, a computer monitor, an equipment apparatus including an automotive display apparatus or another type of apparatus for vehicles, or a mobile electronic device, such as a smartphone or an electronic pad.

Example embodiments of the present disclosure can also be described as follows:

In an aspect of the present disclosure, a display apparatus may comprise: a substrate including a display area and a non-display area outside the display area; a plurality of pixels in the display area; a plurality of touch electrodes overlapping with the pixels in the display area; a gate driving circuit in the non-display area and connected to the touch electrodes via at least one gate driving line; and a touch inspection circuit in the non-display area and connected to the touch electrodes through at least one touch line, the touch inspection circuit including at least one touch inspection switch and a touch inspection control switch.

In some example embodiments, the touch inspection circuit may further include a pad for the touch inspection control switch and a touch pad.

In some example embodiments, the at least one touch inspection switch may be connected with the touch electrodes via the at least one touch line, and the at least one touch line may overlap with and be electrically connected to the touch pad.

In some example embodiments, the pad for the touch inspection control switch may be configured to be connected to a terminal of an auto probe unit.

In some example embodiments, the at least one touch inspection switch may be connected to the at least one gate driving line via at least one corresponding reference line.

In some example embodiments, the at least one touch inspection switch may be connected to the touch electrodes via a plurality of touch lines, and one of the at least one touch inspection switch may be connected to two or more of the touch lines and to only one of the at least one gate driving line.

In some example embodiments, the display apparatus may further comprise a dam disposed in the non-display area, wherein the at least one touch line may be disposed above the dam.

In some example embodiments, the dam may be disposed above the gate driving circuit and at least partially overlap the gate driving circuit.

In some example embodiments, the at least one gate driving line may include a gate high voltage line, a gate low voltage line, an EM driver start line, an EM driver clock line, a scan driver start line, and a scan driver clock line.

In some example embodiments, the touch electrodes may include a plurality of Tx electrodes arranged along a first direction in the display area and a plurality of Rx electrodes arranged along a second direction in the display area, the first direction crossing the second direction.

In some example embodiments, the at least one touch line may include at least one Tx electrode touch line connected to the Tx electrodes and at least one Rx electrode touch line connected to the Rx electrodes.

In some example embodiments, the at least one touch inspection switch may include a transistor, and the touch inspection control switch may include a transistor. A gate electrode of the at least one touch inspection switch may be connected to a drain of the touch inspection control switch.

In another aspect of the present disclosure, a display apparatus may comprise: a substrate including a display area and a non-display area outside the display area; a plurality of light emitting diodes in the display area; a plurality of touch electrodes overlapping with the light emitting diodes in the display area; at least one touch inspection circuit in the non-display area and connected with the touch electrodes, the at least one touch inspection circuit including at least one touch inspection switch and a touch inspection control switch; at least one gate driving circuit in the non-display area and connected with the touch electrodes via at least one gate driving line; and a dam surrounding the display area.

In some example embodiments, the touch inspection circuit may further include a pad for the touch inspection control switch and a touch pad.

In some example embodiments, the at least one touch inspection switch may be connected with the touch electrodes via at least one touch line, and the at least one touch line may overlap with and be electrically connected to the touch pad.

In some example embodiments, the at least one touch inspection switch may be connected to the touch electrodes via at least one touch line.

In some example embodiments, the at least one touch line may be disposed above the dam.

In some example embodiments, the at least one touch inspection switch may be connected to the at least one gate driving line via at least one corresponding reference line.

In some example embodiments, the at least one gate driving line may include a gate high voltage line, a gate low voltage line, an EM driver start line, an EM driver clock line, a scan driver start line, and a scan driver clock line.

In some example embodiments, the touch electrodes may include a plurality of Tx electrodes arranged along a first direction in the display area and a plurality of Rx electrodes arranged along a second direction in the display area, the first direction crossing the second direction.

The features, structures, effects and the like described in the foregoing example embodiments of the present disclosure are included in at least one example embodiment of the present disclosure and are not limited to one example embodiment. Moreover, the features, structures, effects and the like illustrated in at least one example embodiment of the present disclosure may be implemented through combination with or modification of other example embodiments by those skilled in the art. Therefore, the combination and the modification of example embodiments of the present disclosure are included within the scope of the present disclosure.

The present disclosure is not limited to the foregoing example embodiments and the accompanying drawings. It will be apparent to those skilled in the art that various modifications and variations can be made in the present disclosure without departing from the spirit or scope of the disclosures. Thus, it is intended that the present disclosure cover the modifications and variations of this disclosure provided they come within the scope of the appended claims and their equivalents.

What is claimed is:

1. A display apparatus, comprising:
a substrate including a display area and a non-display area outside the display area;
a plurality of pixels in the display area;
a plurality of touch electrodes overlapping with the pixels in the display area;

a gate driving circuit in the non-display area and connected to the touch electrodes via at least one gate driving line; and a touch inspection circuit in the non-display area and connected to the touch electrodes through at least one touch line, the touch inspection circuit including at least one touch inspection switch and a touch inspection control switch.

2. The display apparatus of claim 1, wherein the touch inspection circuit further includes a pad for the touch inspection control switch and a touch pad.

3. The display apparatus of claim 2, wherein the at least one touch inspection switch is connected with the touch electrodes via the at least one touch line, and wherein the at least one touch line overlaps with and is electrically connected to the touch pad.

4. The display apparatus of claim 2, wherein the pad for the touch inspection control switch is configured to be connected to a terminal of an auto probe unit.

5. The display apparatus of claim 1, wherein the at least one touch inspection switch is connected to the at least one gate driving line via at least one corresponding reference line.

6. The display apparatus of claim 5, wherein the at least one touch inspection switch is connected to the touch electrodes via a plurality of touch lines, and wherein one of the at least one touch inspection switch is connected to two or more of the touch lines and to only one of the at least one gate driving line.

7. The display apparatus of claim 1, further comprising:
a dam disposed in the non-display area,
wherein the at least one touch line is disposed above the dam.

8. The display apparatus of claim 7, wherein the dam is disposed above the gate driving circuit and at least partially overlaps the gate driving circuit.

9. The display apparatus of claim 1, wherein the at least one gate driving line includes a gate high voltage line, a gate low voltage line, an EM driver start line, an EM driver clock line, a scan driver start line, and a scan driver clock line.

10. The display apparatus of claim 1, wherein the touch electrodes include a plurality of Tx electrodes arranged along a first direction in the display area and a plurality of Rx electrodes arranged along a second direction in the display area, the first direction crossing the second direction.

11. The display apparatus of claim 10, wherein the at least one touch line includes at least one Tx electrode touch line connected to the Tx electrodes and at least one Rx electrode touch line connected to the Rx electrodes.

12. The display apparatus of claim 1, wherein:
the at least one touch inspection switch includes a transistor,
the touch inspection control switch includes a transistor, and
a gate electrode of the at least one touch inspection switch is connected to a drain of the touch inspection control switch.

13. A display apparatus, comprising:
a substrate including a display area and a non-display area outside the display area;
a plurality of light emitting diodes in the display area;
a plurality of touch electrodes overlapping with the light emitting diodes in the display area;
at least one touch inspection circuit in the non-display area and connected with the touch electrodes, the at least one touch inspection circuit including at least one touch inspection switch and a touch inspection control switch;
at least one gate driving circuit in the non-display area and connected with the touch electrodes via at least one gate driving line; and
a dam surrounding the display area.

14. The display apparatus of claim 13, wherein the touch inspection circuit further includes a pad for the touch inspection control switch and a touch pad.

15. The display apparatus of claim 14, wherein the at least one touch inspection switch is connected with the touch electrodes via at least one touch line, and wherein the at least one touch line overlaps with and is electrically connected to the touch pad.

16. The display apparatus of claim 13, wherein the at least one touch inspection switch is connected to the touch electrodes via at least one touch line.

17. The display apparatus of claim 16, wherein the at least one touch line is disposed above the dam.

18. The display apparatus of claim 13, wherein the at least one touch inspection switch is connected to the at least one gate driving line via at least one corresponding reference line.

19. The display apparatus of claim 13, wherein the at least one gate driving line includes a gate high voltage line, a gate low voltage line, an EM driver start line, an EM driver clock line, a scan driver start line, and a scan driver clock line.

20. The display apparatus of claim 13, wherein the touch electrodes include a plurality of Tx electrodes arranged along a first direction in the display area and a plurality of Rx electrodes arranged along a second direction in the display area, the first direction crossing the second direction.

* * * * *